United States Patent [19]

Lopetrone et al.

[11] Patent Number: 5,014,043
[45] Date of Patent: May 7, 1991

[54] CURRENT SENSING

[75] Inventors: Juan P. Lopetrone, Palos Verdes; Oliver Valdes, West Covina, both of Calif.

[73] Assignee: Southern California Edison, Rosemead, Calif.

[21] Appl. No.: 277,551

[22] Filed: Nov. 29, 1988

Related U.S. Application Data

[63] Continuation-in-part of Ser. No. 129,160, Dec. 7, 1987, Pat. No. 4,837,517.

[51] Int. Cl.$^5$ .................. G01R 31/02; G01R 19/00
[52] U.S. Cl. ............................ 340/664; 340/650; 324/529
[58] Field of Search ........... 324/527, 528, 529, 117 H, 324/117 R, 127; 340/664, 650, 651; 336/84, 212; 323/368, 294

[56] References Cited

U.S. PATENT DOCUMENTS

| | | | |
|---|---|---|---|
| 2,259,285 | 10/1941 | Barnes | 324/117 R |
| 3,226,640 | 12/1965 | Kuhrt | 324/117 H |
| 3,573,616 | 4/1971 | Kahen | 324/117 H |
| 3,693,085 | 9/1972 | Beard | 324/117 H |
| 3,771,049 | 11/1973 | Piccione | 340/664 |
| 3,816,816 | 6/1974 | Schweitzer Jr. | 324/133 |
| 3,906,477 | 9/1975 | Schweitzer Jr. | 340/253 |
| 3,991,366 | 11/1976 | Schweitzer Jr. | 324/133 |
| 4,034,360 | 7/1977 | Schweitzer Jr. | 340/253 |
| 4,182,982 | 1/1980 | Wolf et al. | 324/127 |
| 4,266,189 | 5/1981 | Karlin et al. | 324/117 H |
| 4,288,743 | 9/1981 | Schweitzer | 324/127 |
| 4,375,403 | 3/1983 | Schweitzer Jr. | 324/133 |
| 4,438,403 | 3/1984 | Schweitzer Jr. | 324/133 |
| 4,546,309 | 10/1985 | Kang et al. | 324/52 |
| 4,700,131 | 10/1987 | Miller | 324/117 |
| 4,739,274 | 4/1988 | Kimball et al. | 324/529 |
| 4,739,275 | 4/1988 | Kimball et al. | 324/529 |

Primary Examiner—Hezron E. Williams
Attorney, Agent, or Firm—Charles Berman; Sheldon & Mak

[57] ABSTRACT

A current sensing device particularly for rotor ground fault detection in a highly inductive field is able to sense and identify the location of low order fault current when the load current in conductors is on the order of at least 1,000 amperes. Laminated strips of magnetic material are flexible to be located ideally about the conductors to maximize the sensitivity signal and minimize the effect of electromagnetic radiation. The current sensor includes three sets of laminations, the central laminations being for magnetization sensing, the inner laminations being for magnetic filtering, and outer laminations being for magnetic shield. Magnetic separation exists between each lamination set. Electrical insulation is located about the inner and outer sets.

60 Claims, 3 Drawing Sheets

CURRENT SENSING

RELATED APPLICATION

This application is a continuation-in-part of Ser. No. 129,160, now U.S. Pat. No. 4,837,517 filed Dec. 7, 1987, entitled "Fault Detection". The contents of that application are incorporated by reference herein.

BACKGROUND

This invention relates to current sensing. In particular, it relates to sensing of currents in a highly inductive field where currents are high and small changes in the current are required to be sensed.

Different current sensors are known for detecting magnetic changes as an indication of a measurement of current. These sensors include a magnetic sensor in the nature of a Hall Effect element located in adjacency with magnetic laminations. The devices are usually clamped about one or more electrical conductors and the change of the magnetic field about the conductors is detected by the Hall Effect device as transmitted by the magnetic laminations. These changes are translated into a current measurement. The device is usually in the form of two semi-circular elements which open and close about a common hinge point so that it can be fitted about the conductor. A locking device or spring device secures the elements which are constituted by the laminations about the conductor. The Hall Effect device is located in a slot formed in the magnetic laminations in one of the semi-circular elements. Consequently, at least three breaks exist in the magnetic path of magnetic sensors in prior art devices. This limits the magnetic effectiveness of the device and hence the current sensing ability and sensitivity of the device.

In another known magnetic sensor, a magnetic core is formed of laminations of magnetic material strips which are located in a circular fashion about a conductor in a manner so that free ends abut each other. The laminations are of a rigid material in a single set and are permanently located about a conductor. A magnetic sensing winding is located over the laminations. The laminations are prestressed so that there is a closing force to maintain end portions in engagement with a minimum reluctance. Openings are provided in the strips to provide saturable sections to limit the magnetic flux induced in the core. Moreover, the device is responsive to the high saturation conditions and, hence, the magnetic material of the device is of low permeability.

In the prior art sensing devices known to the Applicants the magnetic strips or the lamination construction is of a rigid nature. Hence there is no ability to adjust the current sensing device to accommodate the best magnetic configuration relative to the conductor configuration about which it is placed. Moreover, the prior art devices do not include arrangements for sensitivity determinations of current in a highly inductive field where there are large current flows and where unwanted effects of the adjacent electromagnetic fields are overcome. There is accordingly a need to provide a current sensing device which overcomes these difficulties.

A need particularly arises for reading small fault currents, for instance, in electrical power generation systems. In such systems, there are extremely high currents generated and there is the possibility of small ground faults occurring, for instance, in the rotor, or the exciter associated with a generator. Such small currents need to be detected early and when very low in value so as to prevent unnecessary and costly downtime of an entire generator unit.

It is also desirable to be able to detect the existence of small rotor ground faults at times when the rotor is in either a state of shutdown, startup, or in operation. By the early detection of the low ground fault currents, and consequent preventive maintenance of the systems, expensive generator downtime is minimized. Particularly, by being able to detect ground faults during the operational state, wasteful downtime is avoided.

There is also a need to provide means for being able to determine whether the fault is in the generator or exciter sides of the electric power generator system. By being able to detect faults on the exciter side, it is easier and less expensive to shut down simply the exciter and not the generator rotor. Accordingly, there is a need to have a ground current detector for use in a fault system for a power generator which has the ability to determine on which side of the detector the fault is located.

In Patent Application Ser. No. 129,160, the technique is described by which a fault current is detected in a highly sensitive mode. By use of a synchronization signal and by dissipation of the effect of stray capacitance from the circuit, there is the ability to sense small levels of fault current. This system is employed in the ground fault current detection in rotor systems of the present invention.

SUMMARY

By this invention, there is provided a means and a method for sensitive current detection in systems carrying relatively much higher currents. There is provided a system for shielding undesirable electromagnetic effects from a current sensing device.

According to the invention a current sensing device comprises at least two sets of laminations of a magnetic material, and means for magnetically separating the sets. The laminations are of a flexible material for wrapping about an electric conductor. One lamination set is closer to the conductor than the second set. The flexible material has opposite free ends and a magnetic sensor is located between the opposite free ends of one of the sets of laminations when the free ends are located in abutment about the conductor. Locking means is provided for securing the free ends of the laminations in abutment.

In a preferred form of the invention there are three sets of laminations, namely a central or first set for magnetic sensing, an outer set is for magnetic shielding and an inner set for magnetic filtering or buffering. With the inner magnetic set the device can be adjusted relative to the conductor over a larger radial difference without effecting the magnetic field sensed by the measuring laminations of the first lamination set.

The means for magnetically separating the sets is formed of a suitable plastic material. About the outer and inner set there is an electrical insulating plastic material which extends in width beyond the width of the laminations.

Also according to the invention the current sensing device is used in sensing rotor ground fault detections in the order of less than 10 milliamps where the rotor current can be about 1,000 amps.

The invention is further described with reference to the accompanying drawings.

DRAWINGS

DESCRIPTION

Figure 1:
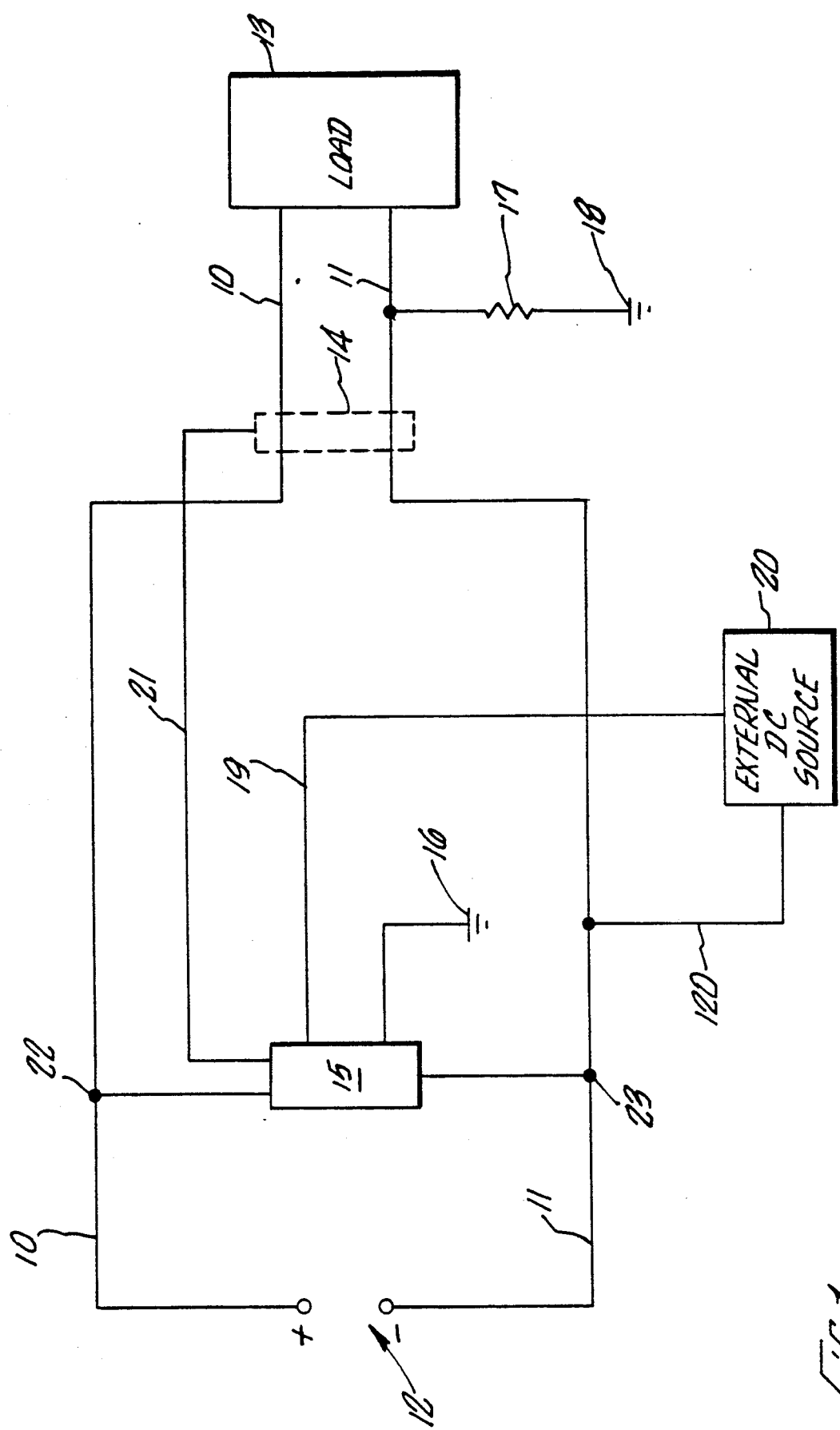
FIG. 1 is a basic circuit diagram illustrating the location of the current sensing device in circuit in relation to a circuit in which a rotor ground fault is to be located.

In FIG. 1, a representative diagram of an exciter circuit for an alternating current generator is shown. The conductors 10 and 11 are buss bars, cables or conductors for transmitting 90–460 volt DC power to a load 13, which represents the brush assembly and rotor DC circuit of the exciter for an alternating power generator which is shown as a load. The DC voltage source is obtained from a DC power exciter-generator.

The buss bars 10 and 11 are either circular conductors or pairs of circular conductors or, alternatively, rectangular conductors. The rectangular conductors could be made of copper and have the size of approximately 6 inches by 1 inch and are mounted in spaced relationship in a range between several inches apart to about 15 inches apart or even greater, depending upon the amount of current to be carried by the buss bars 10 and 11. The circular conductors are of a sufficient size so that a current sensing device 14 has a lamination set with an inner diameter of about 6 inches so that the conductors can be located within the current sensing device 14.

Where the buss bars 10 and 11 are located at a greater spaced apart spacing, the set of laminations of magnetic material have a circumferential length to extend about both sets of conductors. The shape of the current sensing device 14 would be non-circular about the conductors. Hence the flexible nature of the device 14 permits for this varied use according to the nature of the conductors in which current is to be sensed.

In some cases, the current sensing device 14 may be located about only one of the buss bars 10 and 11. In this event an extra winding is provided to the system for current sensing to simulate the current which would flow through the opposite or return buss bar.

The current sensing device 14 essentially is connected with a locator unit 15 to measure the differential between current flowing between the two buss bars 10 and 11. The locator 15 includes a resistor network including the resistor bank for resistors which are selectively connected to the buss bars 10 and 11 essentially in terms of the switching system described fully in Patent Application Ser. No. 129,160. The contents of that application and the technique used therein is incorporated at this point in describing the manner in which the locator 15 determines the location of a fault in the DC rotor ground fault circuit.

The buss bars 10 and 11 carry a load current of about 1,000 amps or greater and thus generate a large magnetic field with a high inductance. The locator unit 15 is periodically connected to ground 16 through an interrupter circuit so as to connect periodically the buss bars 10 and 11 through the resistor bank network in locator 15 between buss bars 10 and 11 in turn and to ground 16.

The locator 15 includes a synchronization system so that a synchronization signal is applied to the system. As such, the fault current through a ground fault, illustratively depicted by resistor 17 connected to ground 18, is detected when there is a steady state pulse level of the ground fault current on buss bars 10 or 11.

Locator 15 also generates a secondary synchronization signal 19 which is directed to an external DC source 20 for activating an artificial ground fault current with a precision of as low as about 5 milliamps. The ground fault current is directed along line 120 to buss bar 11 in the circuit illustrated. By a switching system in the locator 15, the external DC source 20 can alternatively be connected with a buss bar 10. In this manner, the locator 15 can determine whether the ground fault is on the negative buss bar 11 or the positive buss bar 10 of the rotor circuit. In some cases, the external DC source 20 is part of the locator unit 15 even though illustrated separately in FIG. 1. The external DC source 20 is operational for detecting a fault in the exciter DC circuit when the exciter circuit is non-operational, namely, the external DC source 20 then applies an artificial DC source for locating the ground fault in the circuit. Fault currents sensed by the sensing device 14 is transmitted along line 21 to the fault locator 15.

The locator 15 is connected to the buss bar 10 at terminal 22 and the buss bar 11 at terminal 23. This is between the supply source 12 and the location of the current sensing device 14. The locator 15 can similarly be connected between the sensing device 14 and the load 13. Switching in the locator 15 can provide for the alternative connection between the source 12 and sensing device 14 or between the sensing device 14 and the load 13. In this manner, the sensing device 14 with the locator 15 has the ability to determine whether the fault is between the DC source 12, the location of the locator 15 and the load 13. Thus, as illustrated in FIG. 1, the sensing device 14 determines faults between the locator 15 and the load 13. Should the locator 15 be connected between the sensing device 14 and the load 13, the sensing device 14 then determines faults between the source 12 and the sensing device 14. The relative connection of 14 and 15 into circuit relative to the load 13 and source 12 can be changed through electronic or manual switching.

Figure 2:
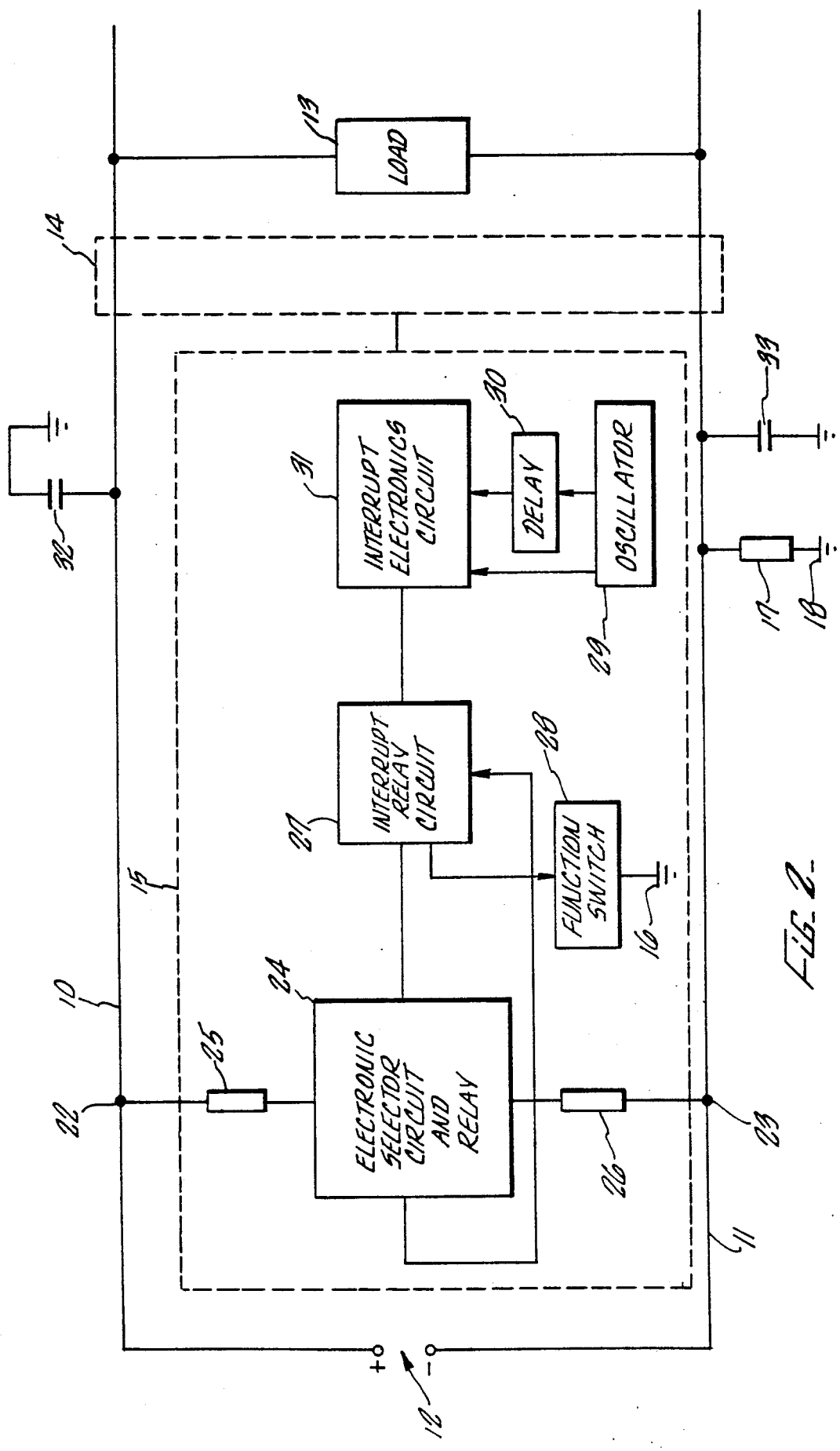
FIG. 2 is a simplified block circuit diagram illustrating certain components of the sensing system.

In FIG. 2, the ground fault detector illustrated in FIG. 1 is shown in more detail. The automatic selector circuit 24 detects any imbalance on the distribution system of buss bars 10 and 11 and chooses one of the resistors 25 or 26 to be alternatively connected to the input of the interrupt relay 27 and from the interrupter relay 27 to function switch 28 which is connected to ground 16. The magnetic sensing device 14 is also shown and the output of the sensing device 14 is connected to an input circuit to the fault locator which is diagrammatically illustrated as 15 in FIG. 2. An oscillator 29 is connected to a delay circuit 30 and this activates the interrupt electronic circuit 31 which connects with the interrupter relay 27. The oscillator circuit 29 is also directly connected to the interrupt electronic circuit 31 for timing operation of the interrupters and detection. The circuit also shows stray capacitances 32 and 33, although these will not be of major importance in the highly inductive circuit associated with DC rotor ground fault detection. Omitted from FIG. 2 is the external DC source 20 and the synchronization signal line and other lines associated with the DC source as illustrated in FIG. 1.

Figure 3:
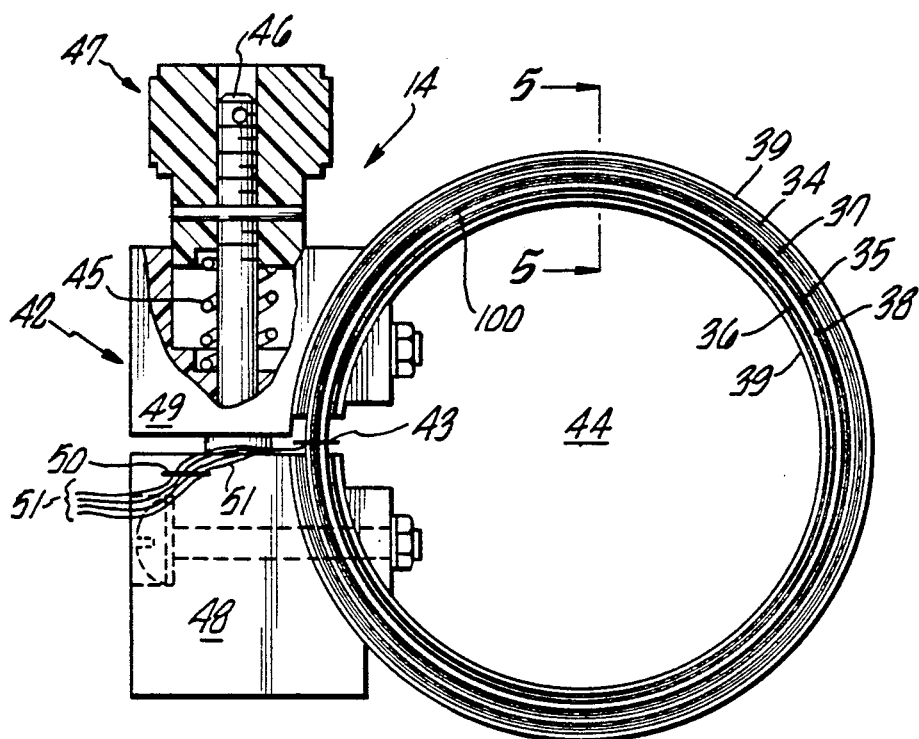
FIG. 3 is an end view of a current sensing device with part of the securing means shown in sections.
Figure 5:
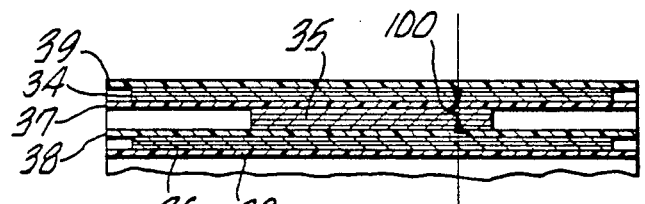
FIG. 5 is a sectional view of the device along line 5—5 of FIG. 1.
Figure 4:
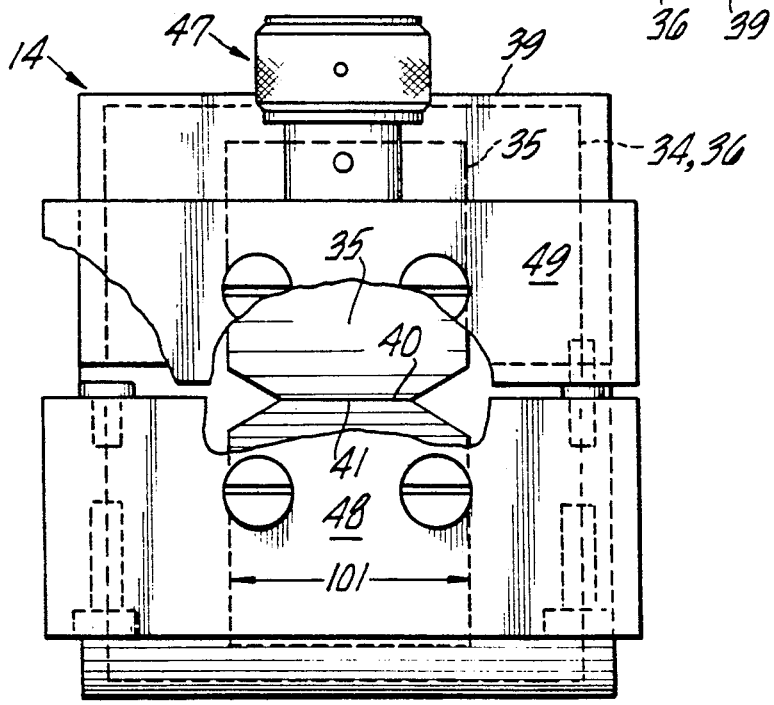
FIG. 4 is a side view of the securing means shown partly in section.

In FIG. 3, there is illustrated a current sensing device 14. There are three sets of magnetic lamination sets 34, 35 and 36. Set 34 is the outer set of laminations, set 35 is the central first set, and set 36 is the inner second set. The lamination set 34 protect the inner set 35 against external electromagnetic radiation. The central magnetic laminations 35 are the magnetic measuring laminations. An inner magnetic lamination 36 provides for magnetic buffering and filtering of magnetic changes which may occur inside the core or diameter of the sensing device 14. This, for instance, would be due to changes from current passing through the buss bar conductor or conductors 10 and 11 in the central core 44 of the current sensing device 14. The laminations of the sets 34, 35 and 36 have a thickness, numeral 100, less than a width, numeral 101. The width 101 is in general alignment with the longitudinal axis of the electrical conductors 10 and 11.

A securing means 42 includes a spring 45 which is under compression and surrounds a shank 46 of a bolt 47. When the bolt 47 is pressed towards component 48 of the securing device 42 and turned clockwise or anti-clockwise, a locking characteristic is imparted to the securing device 14. The bolt 47 is mounted in component 49 of the securing means 42. A connector or electronic element 50 is located in component 48 and is connected to the Hall Effect device 43 between the abutting ends 40 and 41 of the central magnetic set 35. Four conductors 51 from the electronic element 50 take signals from the Hall Effect device 43 for processing in the remainder of the sensing and locator circuitry.

The laminations of magnetic material of the sets 34, 35 and 36 are of high permeable material. Conveniently, a material Supermalloy (TM) of highly refined and specially processed nickel iron alloy is used. The permeability of the material is high, namely, between 60,000 to 100,000 and, consequently, the magnetic loss is low.

The inner lamination set 36 provides for a buffering of the magnetic field imparted by the buss bar conductors 10 and 11 When the sensing device 14 is rotated through about 10 degrees there is little difference in the magnetic signal sensed by the Hall Effect device 43 due to the load current. The set 36 effectively, therefore, acts as a filtering for the sensing device 14. Between the sets 34, 35 and 36 there is electrical insulation which acts to separate magnetically the sets 34, 35 and 36. Insulation 39 is located about the outside of sets 34 and 36. The electrical insulation 39 and spacers 37 and 38 extend beyond the width 101 of the sets 34, 35 and 36.

The lamination material of sets 34, 35 and 36 are in the form of a belt or strap and are thus flexible such that the device 14 can be wrapped about conductors 10 and 11. Thus whether the conductors 10 and 11 are circular or rectangular the sets can adapt in a flexible manner to the position most effective to achieve high sensitivity with the high current flowing through the conductors 10 and 11. The fault current sensitivity can be less than 100 milliamps and, in fact, as low as 10 milliamps when the load current flowing through the conductors 10 and 11 is in the order of 1,000 or more amperes.

The Hall Effect device 43 is affixed in an inset position in abutment between the free ends 40 and 41 of the central first lamination set 35 by an epoxy. Thus, if there is any defect in the Hall Effect device 43, this device 43 can easily be removed and replaced. The lamination sets 34, 35 and 36 are integral except for the single division or cut at the abutment ends 40 and 41 for the first set 35 and equivalent abutment points for the outer and inner sets 34 and 36. This minimizes any magnetic leakage. The locking effect ensures a tight flush location of the abutting ends of the laminations.

With the device of the invention, fault currents can be determined both during startup, shutdown, off and on conditions of an electrical power-generating systems by effectively connecting the current sensing device 14 in the circuit of FIGS. 1 and 2. The signal used for detection is that generated by an interrupted pulse DC fault signal.

The invention is described with reference to a particular embodiment which is exemplary only. Many other forms of the invention exist, each differing from the other in matters of detail. For instance, instead of two or three sets of laminations of a magnetic material, there could be more sets; for instance, five sets. This could mean more inner lamination sets for eliminating undesirable effects of the load current and selective positioning to increase internal shielding. The Hall Effect device 43 can be physically protected between the abutting ends 40 and 41 by a surrounding of non-magnetic material located to at least partly frame the Hall Effect device. Also, instead of circular shaped sensor, the sensor can be of a rectangular configuration, which could be particularly useful for rectangular buss bars. The invention should be considered as defined by the following claims.

We claim:

1. A method for current sensing comprising locating at least two magnetically separated spaced sets of laminations of magnetic material about an electrical conductor, so that the one lamination set is closer to the conductor than the other, magnetically sensing a change in a magnetic field between the opposite free ends of a first set of the laminations when free ends of the laminations are located adjacently and about the conductor, and securing the free ends of the lamination sets in adjacency, the set located outside the first set acting as a magnetic shield of the magnetic field directed from outside towards the first set of laminations.

2. A current sensing device comprising at least two strips of a magnetic material, means for magnetically separating the strips, the strips being for location about an electrical conductor so that a second strip is parallel to the conductor and a first strip, the strips having opposite free ends and at least the first strip being integral, a magnetic sensor for location between opposite free ends of the first strip when the free ends are located adjacently, and means for securing the free ends of the strips in adjacency, wherein one strip is structurally constituted by elongated strips of magnetic material, the strips having a thickness and a width, and the width being for general alignment with a longitudinal axis of the electrical conductor and wherein the second strip is structurally similar to the first strip and the second strip is located relative to the first strip and acts as a magnetic filter of the magnetic field relative to the first strip.

3. A current sensing device comprising at least two sets of laminations of a magnetic material, means for magnetically separating the sets, the laminations being for location about an electrical conductor so that a second lamination set is closer to the conductor than a first set, the laminations having opposite free ends, a magnetic sensor for location adjacent the first set of laminations when the free ends are located adjacently, means for securing the free ends of the lamination set in adjacency, one set of laminations being structurally constituted by elongated strips of magnetic material, the strips having a thickness and a width, the thickness being substantially less than the width, and the width being for general alignment with a longitudinal axis of the electrical conductor, and wherein the second set is structurally similar to the first set of laminations and the second set is located inside the first set and acts as a magnetic filter of the magnetic field emanating from the conductor to the first set of laminations.

4. A device as claimed in claim 3 including a third set of laminations, the third set being located outside the first set of laminations and acting as a magnetic shield of the magnetic field directed from outside towards the first set of laminations.

5. A device as claimed in claim 4 wherein the third set of laminations is structurally similar to the first set of laminations.

6. A device as claimed in claim 5 including means for magnetically separating the first and third sets of laminations of magnetic material.

7. A device as claimed in claim 6 including electrical insulation about the outside of the second and third sets of laminations.

8. A device as claimed in claim 7 wherein the magnetic sensor is a Hall Effect device located transverse the first set of laminations.

9. A device as claimed in claim 8 wherein the laminated material is flexible thereby to conform requisitely relative to the shape of the electrical conductor.

10. A device as claimed in claim 9 wherein the magnetic material is relatively highly permeable.

11. A device as claimed in claim 10 having a sensitivity to detect changes in current in the electrical conductor of less than about 100 milliamps where the electrical conductor carries a current of greater than several hundred amperes.

12. A device as claimed in claim 11 wherein the sensed current is less than about 10 milliamps where the current of the electrical conductor is at least about 1,000 amps.

13. A device as claimed in claim 12 wherein the means for securing the free ends of the laminations is a releasable lock.

14. A device as claimed in claim 13 wherein the releasable lock includes a spring-loaded catch.

15. A device as claimed in claim 14 wherein, in the operative position, the free ends of the laminations are in close physical abutment, and wherein each lamination of the set is integral between its free ends.

16. A device as claimed in claim 15 wherein the electrical insulation extends in width beyond the width of the laminations.

17. A device as claimed in claim 3 including electrical insulation about the outside of the lamination sets.

18. A device as claimed in claim 3 wherein the magnetic sensor is a Hall Effect device located between the opposite free ends of the first set of laminations.

19. A device as claimed in claim 18 wherein the Hall Effect device is inserted into one of the free ends of the laminations.

20. Apparatus for determining rotor fault current in a power generation system comprising a current sensing device having at least three sets of laminations of a magnetic material, means for magnetically separating the sets, the laminations being for location about a pair of electrical conductors so that a second lamination set is closer to the conductors than a first set, a third set of laminations being located outside the first set of laminations, the laminations having opposite free ends, a magnetic sensor for location between the opposite free ends of the first set of laminations when the free ends are located adjacently and about the conductors, means for securing the free ends of the lamination set in adjacency, and means for translating a change in a sensed magnetic field from the conductors to provide an indication of a ground fault current, wherein the magnetic sensor is a Hall Effect device located transverse the first set of laminations, the laminations being flexible thereby to conform requisitely relative to the shape of the electrical conductor, and wherein the magnetic material is highly permeable, and including means for connecting the apparatus in circuit between a DC power source to the system and the sensor location, or between the sensor location and a load to the system thereby to permit an indication of the fault location.

21. Apparatus as claimed in claim 20 wherein the apparatus is selectively located through a resistor to either the positive or negative side of the DC system.

22. Apparatus as claimed in claim 21 including an independent power source to activate the apparatus during a down state of the DC system.

23. A method for current sensing comprising locating at least two magnetically spaced sets of laminations of magnetic material about a conductor so that a second lamination set is closer to the conductor than a first set, magnetically sensing a change in a magnetic field between the opposite free ends of the first set of laminations when free ends of the laminations are located adjacently and about the conductor, securing the free ends of the lamination sets in adjacency, and locating about the conductor a third magnetically spaced set of laminations to act as a magnetic shield of the magnetic field directed from outside towards the first set of laminations which is for magnetic sensing, and wherein the second set is for magnetic filtering.

24. A method as claimed in claim 23 having a sensitivity to detect changes in current in the electrical conductor of less than about 100 milliamps where the electrical conductor carries a current of greater than several hundred amperes.

25. A method as claimed in claim 24 including securing the free ends of the laminations with a releasable lock.

26. A current sensing device comprising at least two sets of laminations of a magnetic material, means for magnetically separating the sets, the laminations being for location about an electrical conductor so that a second lamination set is closer to the conductor than a first set, the laminations having opposite free ends, a magnetic sensor for location adjacent the first set of laminations when the free ends are located adjacently, means for securing the free ends of the lamination set in adjacency and a third set of laminations, the third set being located outside the first set of laminations and acting as a magnetic shield of the magnetic field directed from outside towards the first set of laminations.

27. A device as claimed in claim 26 wherein one set of laminations is structurally constituted by elongated strips of magnetic material, the strips having a thickness and a width, the thickness being substantially less than the width, and the width being for general alignment with a longitudinal axis of the electrical conductor.

28. A device as claimed in claim 26 wherein the third set of laminations is structurally similar to the first set of laminations.

29. A device as claimed in claim 26 including means for magnetically separating the first and third sets of laminations of magnetic material.

30. A device as claimed in claim 26 including electrical insulation about the outside of the second and third sets of laminations.

31. A device as claimed in claim 26 wherein the magnetic sensor is a Hall Effect device located transverse the first set of laminations.

32. A device as claimed in claim 26 wherein the laminated material is flexible thereby to conform requisitely relative to the shape of the electrical conductor.

33. A device as claimed in claim 26 wherein the magnetic material is relatively highly permeable.

34. A device as claimed in claim 26 having a sensitivity to detect changes in current in the electrical conductor of less than about 100 milliamps where the electrical conductor carries a current of greater than several hundred amperes.

35. A device as claimed in claim 26 wherein the sensed current is less than about 10 milliamps where the current of the electrical conductor is at least about 1,000 amps.

36. A device as claimed in claim 35 wherein the means for securing the free ends of the laminations is a releasable lock.

37. A device as claimed in claim 36 wherein the releasable lock includes a spring-loaded catch.

38. A device as claimed in claim 26 wherein, in the operative position, the free ends of the laminations are in close physical abutment, and wherein each lamination of the set is integral between its free ends.

39. A device as claimed in claim 30 wherein the electrical insulation extends in width beyond the width of the laminations.

40. A current sensing device comprising at least three sets of laminations of a magnetic material, means for magnetically separating the sets, the laminations being flexible for wrapping location about a pair of electrical conductors so that a second lamination set is closer to the conductors than the first set and acts as a magnetic filter of the magnetic field emanating from the conductors, the third set of laminations being located outside the first set of laminations, the laminations having opposite free ends, a magnetic sensor for location between the opposite free ends of the first set of laminations when the free ends are located in abutment about the conductors, and means for securing the free ends of the lamination set in adjacency.

41. A device as claimed in claim 40 wherein the means for securing the free ends of the laminations is a releasable lock including a spring-loaded catch.

42. Apparatus for determining rotor fault current in a power generation system comprising a current sensing device having at least three sets of laminations of a magnetic material, means for magnetically separating the sets, the laminations being for location about a pair of electrical conductors so that a second lamination set is closer to the conductors than a first set and acts as a magnetic filter of the magnetic field emanating from the conductors, the third set of laminations being located outside the first set of laminations, the laminations having opposite free ends, a magnetic sensor for location between the opposite free ends of the first set of laminations when the free ends are located adjacently and about the conductors, means for securing the free ends of the lamination set in adjacency, and means for translating a change in a sensed magnetic field from the conductors to provide an indication of a ground fault current.

43. A method for current sensing comprising locating at least two magnetically separated sets of laminations of magnetic material about a conductor so that a second lamination set is closer to the conductor than a first set and acts as a magnetic filter of the magnetic field emanating from the conductors, magnetically sensing a change in a magnetic field between the opposite free ends of the first set of laminations when free ends of the laminations are located adjacently and about the conductor, and securing the free ends of the lamination sets in adjacency.

44. A current sensing device comprising at least two sets of laminations of a magnetic material about a first set of laminations, means for magnetically separating the sets, the laminations being for location about an electrical conductor, the laminations having opposite free ends, a magnetic sensor for location adjacent a first set of laminations of the set when the free ends are located adjacently, and means for securing the free ends of the lamination set in adjacency, the set located outside the first set of laminations acting as a magnetic shield of the magnetic field directed from outside towards the first set of laminations.

45. A current sensing device comprising at least two sets of laminations of a magnetic material, means for magnetically separating the sets, the laminations being for location about an electrical conductor so that a second lamination set is closer to the conductor than a first set, the laminations having opposite free ends, a magnetic sensor for location between opposite free ends of the first set of laminations when the free ends are located adjacently, and means for securing the free ends of the lamination set in adjacency and wherein the second set is structurally similar to the first set of laminations and the second set is located inside the first set and acts as a magnetic filter of the magnetic field emanating from the conductor to the first set of laminations.

46. A device as claimed in claim 45 wherein one set of laminations is structurally constituted by elongated strips of magnetic material, the strips having a thickness and a width, the thickness being substantially less than the width, and the width being for general alignment with a longitudinal axis of the electrical conductor.

47. A current sensing device comprising at least two sets of laminations of a magnetic material, means for magnetically separating the sets, the laminations being for location about an electrical conductor so that a second lamination set is closer to the conductor than a first set, the laminations having opposite free ends, a magnetic sensor for location between opposite free ends of the first set of laminations when the free ends are located adjacently, and means for securing the free ends of the lamination set is adjacency including a third set of laminations, the third set being located outside the first set of laminations and acting as a magnetic shield of the magnetic field directed from outside towards the first set of laminations.

48. A device as claimed in claim 47 wherein the third set of laminations is structurally similar to the first set of laminations.

49. A device as claimed in claim 47 including means for magnetically separating the first and third set of laminations of magnetic material.

50. A device as claimed in claim 47 including electrical insulation about the outside of the second and third sets of laminations.

51. A device as claimed in claim 45 wherein the magnetic sensor is a Hall Effect device located transverse the first set of laminations.

52. A device as claimed in claim 45 wherein the laminated material is flexible thereby to conform requisitely relative to the shape of the electrical conductor.

53. A device as claimed in claim 45 having a sensitivity to detect changes in current in the electrical conductor of less than about 100 milliamps where the electrical conductor carries a current of greater than several hundred amperes.

54. A device as claimed in claim 45 wherein the means for securing the free ends of the laminations is a releasable lock.

55. A device as claimed in claim 54 wherein the releasable lock includes a spring-loaded catch.

56. A device as claimed in claim 45 wherein, in the operative position, the free ends of the laminations are in close physical abutment, and wherein each lamination of the set is integral between its free ends.

57. A device as claimed in claim 47 including electrical insulation about the outside of the lamination sets.

58. A device as claimed in claim 45 including electrical insulation about the outside of the lamination sets.

59. A device as claimed in claim 51 wherein the Hall Effect device is inset into one of the free ends of the laminations.

60. A device as claimed in claim 45 wherein the first set of laminations is constituted by elongated strips of magnetic material, the strips having a thickness and a width, and wherein the free ends of the first set of laminations has a width substantially less than the width of the elongated strip.

* * * * *